US 6,743,733 B2

(12) United States Patent
Kitsunai et al.

(10) Patent No.: US 6,743,733 B2
(45) Date of Patent: Jun. 1, 2004

(54) PROCESS FOR PRODUCING A SEMICONDUCTOR DEVICE INCLUDING ETCHING USING A MULTI-STEP ETCHING TREATMENT HAVING DIFFERENT GAS COMPOSITIONS IN EACH STEP

(75) Inventors: Hiroyuki Kitsunai, Chiyoda (JP); Junichi Tanaka, Tsuchiura (JP); Takashi Fujii, Kudamatsu (JP); Motohiko Yoshigai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/946,507

(22) Filed: Sep. 6, 2001

(65) Prior Publication Data

US 2003/0040191 A1 Feb. 27, 2003

(30) Foreign Application Priority Data

Aug. 23, 2001 (JP) ........................................ 2001-253099

(51) Int. Cl.[7] ...................... H01L 21/302; H01L 21/461
(52) U.S. Cl. ...................... 438/710; 438/714; 438/725; 438/706; 438/905; 438/907
(58) Field of Search ............... 438/710, 714, 438/725, 905, 906, 907, 706, 729, 711, 723, 724, 707, 730; 156/643.1; 134/1.2, 1.3, 1.1

(56) References Cited

U.S. PATENT DOCUMENTS

| 4,505,782 | A | * | 3/1985 | Jacob et al. ............ 204/192.32 |
| 4,615,761 | A | * | 10/1986 | Tada et al. ..................... 216/60 |
| 5,108,542 | A | * | 4/1992 | Lin ................................ 216/75 |
| 5,110,408 | A | * | 5/1992 | Fujii et al. ............. 204/192.37 |
| 5,252,178 | A | * | 10/1993 | Moslehi ....................... 134/1.1 |
| 5,277,750 | A | * | 1/1994 | Frank .................... 204/192.25 |
| 5,486,235 | A | * | 1/1996 | Ye et al. ....................... 134/1.1 |
| 5,507,874 | A | * | 4/1996 | Su et al. .......................... 134/1 |
| 5,540,812 | A | * | 7/1996 | Kadomura ................... 438/669 |
| 5,639,341 | A | * | 6/1997 | Tabara ................. 118/723 MA |
| 5,716,494 | A | * | 2/1998 | Imai et al. ................... 438/700 |
| 5,756,400 | A | * | 5/1998 | Ye et al. ....................... 134/1.1 |
| 5,817,578 | A | * | 10/1998 | Ogawa ......................... 134/1.1 |
| 5,843,239 | A | * | 12/1998 | Shrotriya .................... 134/1.1 |
| 5,846,373 | A | * | 12/1998 | Pirkle et al. ............ 156/345.25 |
| 6,017,826 | A | * | 1/2000 | Zhou et al. ................... 216/67 |
| 6,186,153 | B1 | * | 2/2001 | Kitsunai et al. ............. 134/1.1 |
| 6,274,500 | B1 | * | 8/2001 | Xuechun et al. ............ 438/706 |
| 6,331,380 | B1 | * | 12/2001 | Ye et al. ....................... 430/311 |
| 6,426,302 | B2 | * | 7/2002 | Kitagawa .................... 438/710 |

FOREIGN PATENT DOCUMENTS

| JP | 62-250185 | * | 11/1986 |
| JP | 02-138472 | * | 5/1990 |
| JP | 407045587 A | * | 2/1995 |

* cited by examiner

Primary Examiner—Amir Zarabian
Assistant Examiner—Khanh B. Duong
(74) Attorney, Agent, or Firm—Antonelli, Terry, Stout & Kraus, LLP

(57) ABSTRACT

By conducting etching treatment using at least two steps with different compositions of gases for each step, and at least one step comprising using a gas capable of decomposing and vaporizing etching products in an etching apparatus continuously, semicondictor devices can be produced with high productivity, low contaminant and good reproducibility of treatment state.

20 Claims, 7 Drawing Sheets

PROCESS FOR PRODUCING A SEMICONDUCTOR DEVICE INCLUDING ETCHING USING A MULTI-STEP ETCHING TREATMENT HAVING DIFFERENT GAS COMPOSITIONS IN EACH STEP

BACKGROUND OF THE INVENTION

The present invention relates to a process for producing a semiconductor device, and more particularly, to a process for producing a semiconductor device characterized by effectively removing etching products retained in a treating room.

With recent higher integration of semiconductor devices, circuit patterns become finer and finer to make required processing dimensional accuracy severer. Under such circumstances, reproducibility of treated state becomes important.

For example, in an etching process wherein high processing accuracy is required, in order to realize an anisotropic etching, there is realized a process wherein etching is conducted while protecting side walls with a polymer produced by the etching. But the production of polymer changes depending on the amount of etching product retained in a treating room and wafer temperature. Thus, when the amount of reaction products retained in the treating room changes in each treatment, deposition state of side wall protective film causes deviation among wafers, resulting in causing a problem of poor reproducibility of etching shape. In a recent production process of semi-conductors, even if a deviation of processing dimension is about 10 nm or less, there sometimes produce defective devices.

Further, an etching product retaining in the treating room forms a deposited film on inner wall of the etching apparatus, and peels off when the film thickness reaches to some extent to attach to wafer surface. Such peeled materials are called as contaminants and function as masks at the time of etching processing to produce etching residues, which are one important cause for defective products.

In order to remove such etching products, for example, JP-A-5-144779 proposes to improve quality of the deposited film formed on inner wall of the etching apparatus, and JP-A-7-153751 proposes to conduct dry cleaning using plasma of mixed gases of oxygen gas and chlorine gas.

According to JP-A-5-144779, etching is conducted under conditions for improving the quality of film so as to make the deposited film on inner wall of etching apparatus hardly peeled off. According to this reference, prevention of generation of contaminants may be effective due to difficult peeling of the deposited film on the inner wall of the apparatus, but it is impossible to solve the problem of shift of etching ability by the deposited substance due to a premise of retaining the deposited substance.

According to JP-A-7-153751, a step for plasma cleaning is provided during etching treatment separated from an etching step, said process being characterized by a material to be etched and an etching gas, or a photo-resist made from a carbon compound which is a mask material at the time of etching and a gas composition for removing so-called etching products generated by polymerization of etching gas. According to this process, by removing etching products at each interval of treatment so as to make the reaction products retained in the treating chamber not exceed a predetermined amount, the reproducibility of etching shape is retained within a predetermined value and the formation of deposited film on inner wall of etching apparatus is to be prevented. But the step for plasma cleaning conducted separately from the etching step during etching treatment is a step not pertaining to the production, and thus equal to "downtime" (a time when the apparatus is stopped) from the viewpoint of productivity. Therefore, this process considers cleaning effect for the etching products, but does not consider productivity.

BRIEF SUMMARY OF THE INVENTION

It is an object of the present invention to provide a process for producing a semiconductor device overcoming the problems of prior art mentioned above, said process capable of attaining reproducibility of treatment state and lowering of contaminants by removing reaction products retained in a treating room, while assuring productivity.

The present invention provides a process for producing a semiconductor device using a plasma treating apparatus comprising an etching treatment room, a substrate stage for placing a semiconductor substrate thereon installed in the etching treatment room, a plasma generating means for generating plasma in the etching treatment room, and a gas introducing means for introducing a treating gas into the etching treatment room, said process comprising subjecting the semiconductor substrate placed on the substrate stage to etching treatment using gases, wherein the etching treatment comprises at least two steps using different gas compositions in each step in the same etching treatment room continuously, and at least one step comprises using a gas capable of decomposing and vaporizing compounds produced by the etching treatment.

The present invention also provides a process for producing a semiconductor device mentioned above, wherein the substrate stage has an electrode for electrostatic adsorption and the decomposing and removing step is used for further removing electrode voltage and charge stored in the semiconductor substrate.

The present invention further provides a plasma etching treatment apparatus used for the above-mentioned processes, and a semiconductor device thus produced.

DETAILED DESCRIPTION OF THE INVENTION

Figure 1:
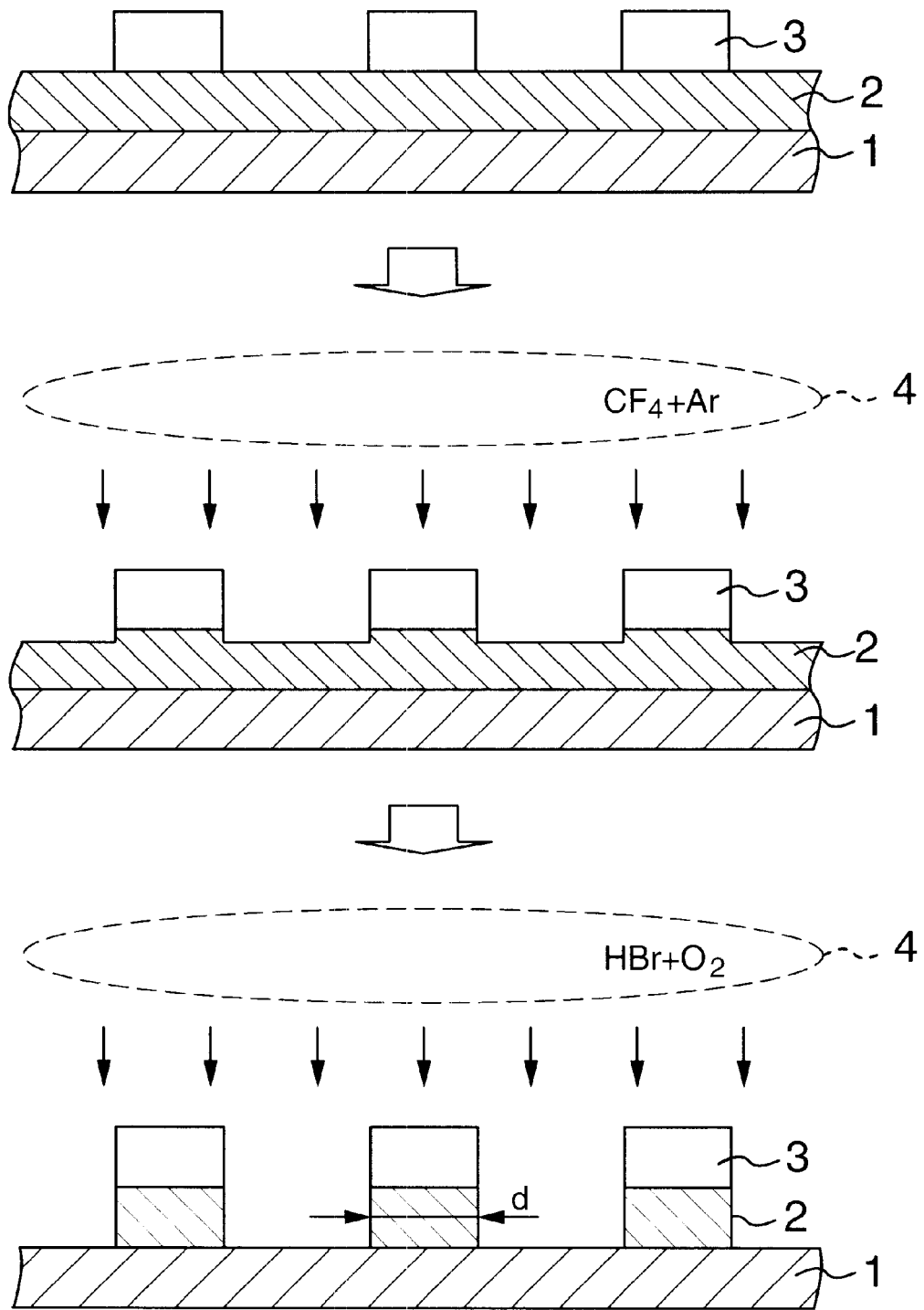
FIG. 1 is a schematic cross-sectional view of a semiconductor substrate for explaining Example 1 of the present invention.

In order to solve the problems of the prior art mentioned above, the present invention provides:

(1) A process for producing a semiconductor device using a plasma treating apparatus comprising an etching treatment room, a substrate stage for placing a semiconductor substrate thereon installed in the etching treatment room, a plasma generating means for generating plasma in the etching treatment room, and a gas introducing means for introducing a treating gas into the etching treatment room, said process comprising subjecting the semiconductor substrate placed on the substrate stage to etching treatment using gases, wherein the etching treatment comprises at least two steps using different gas compositions in each step in the same etching treatment room continuously, and at least one step comprises using a gas capable of decomposing and vaporizing compounds produced by the etching treatment.

In the above process (1), in the case of etching Si and a compound including Si, there can be used as a gas capable of decomposing and vaporizing compounds produced by etching, for example, a gas containing fluorine such as $CF_4$, $CHF_3$, $C_4F_8$, etc., or a mixture of fluorine-containing gas and Ar or $O_2$, e.g. $CF_4+Ar$, etc.

In the case of etching Al and Al alloy, there can be used as a gas capable of decomposing and vaporizing compounds produced by etching, for example, a gas containing oxygen such as $O_2$, etc.

Important thing in the present invention is that the treating gases used in at least two steps should have different chemical compositions.

According to the present invention, the process (1) has the following preferable embodiments.

(2) A process in above (1), wherein the substrate stage has an electrode for electrostatic adsorption and the decomposing and removing step is used for further removing electrode voltage and charge stored in the semiconductor substrate.

(3) A process in above (1), wherein the semiconductor substrate has a film made of silicon or a compound containing silicon thereon, and the gas capable of decomposing and vaporizing compounds retained in the etching treatment room is a gas containing fluorine.

(4) A process in above (1), wherein the semiconductor substrate has a film made of aluminum or a compound containing aluminum thereon, and the gas capable of decomposing and vaporizing compounds retained in the etching treatment room is a gas containing oxygen.

(5) A process in above (1), wherein the semiconductor substrate has a film made of silicon or a compound containing silicon thereon and is held on the substrate stage by applying electrostatic adsorption, and the treating gas in the form of plasma is a gas containing fluorine used for further removing electrode voltage and charge stored in the semiconductor substrate.

(6) A process in above (1), wherein the semiconductor substrate has a film made of aluminum or a compound containing aluminum thereon and is held on the substrate stage by applying electrostatic adsorption, and the treating gas in the form of plasma is a gas containing oxygen used for further removing electrode voltage and charge stored in the semiconductor substrate.

(7) A process in above (1), wherein the plasma treating apparatus further comprises a monitoring means for monitoring a retained amount of the etching products, and the decomposing and removing step is stopped when the retained amount reaches a predetermined lower limit value.

(8) A process in above (2), wherein the decomposing and removing step is stopped when a retained amount reaches a predetermined lower limit value using a monitoring means for monitoring the retained amount of the etching products.

(9) A process in above (1), wherein in the decomposing and removing step the plasma generation position is set apart from the semiconductor substrate.

The present invention further provides a plasma etching treatment apparatus comprising an etching treatment room, a substrate stage for placing a semiconductor substrate thereon installed in the etching treatment room, a plasma generating means for generating plasma in the etching treatment room, a gas introducing means for introducing (a) a treating gas for etching and (b) a treating gas for decomposing and removing etching products, into the etching treatment room, and a monitoring means for monitoring a retained amount of etching products.

Considering above, one of the features of the process of the present invention is to conduct etching treatment of a film or films deposited on the substrate using gases in the form of plasma, said etching treatment comprising at least two steps using different gas compositions in each step, and at least one step comprising using a gas capable of decomposing or vaporizing compounds produced by the etching treatment.

Another feature of the process of the present invention is to conduct etching treatment while holding a film deposited substrate on a substrate stage by applying electrostatic adsorption, and after the etching treatment, there is provided a step for discharging charges stored between the substrate stage and a wafer using a gas capable of decomposing and vaporizing compounds produced by the etching treatment.

A still further feature of the process of the present invention is to determine a time necessary for the treatment using a gas capable of decomposing and vaporizing compounds produced by the etching treatment and retained in the etching apparatus, by monitoring decomposed or vaporized etching products using plasma emission or mass spectrometer, and setting the treating time by a time when the monitored value reaches a lower limit value.

In the present invention, the gas capable of decomposing and vaporizing compounds retained in the etching apparatus includes a gas containing fluorine such as $C_4$ $CHF_3$, $C_4F_8$, etc., which may further contain an inert gas such as Ar, or $O_2$, a gas containing oxygen such as $O_2$, etc.

Gas compositions used for etching treatment and having different compositions means, for example, a combination of $CF_4+Ar/HBr+O_2$, $Cl_2+BCl_3/O_2$, or the like.

The semiconductor device obtained by the above-mentioned processes comprises a substrate, a laminate of at least two kinds of material layers formed on the substrate, and a pattern formed thereon by conducting etching treatment using a gas in the form of plasma, wherein a material for forming at least one film on the substrate is a material which is subjected to etching treatment using a gas capable of decomposing and vaporizing compounds generated at a time of conducting etching treatment of another film.

The present invention is illustrated by way of the following Examples, but needless to say, the present invention is not limited thereto.

EXAMPLE 1

FIG. 1 is a schematic cross-sectional view of a substrate for explaining this Example 1, wherein numeral 1 denotes a silicon substrate, numeral 2 denotes a polysilicon film formed by chemical vapor deposition (CVD) on the substrate 1, and numeral 3 denotes a photoresist having openings on areas to be processed by etching treatment.

Figure 2:
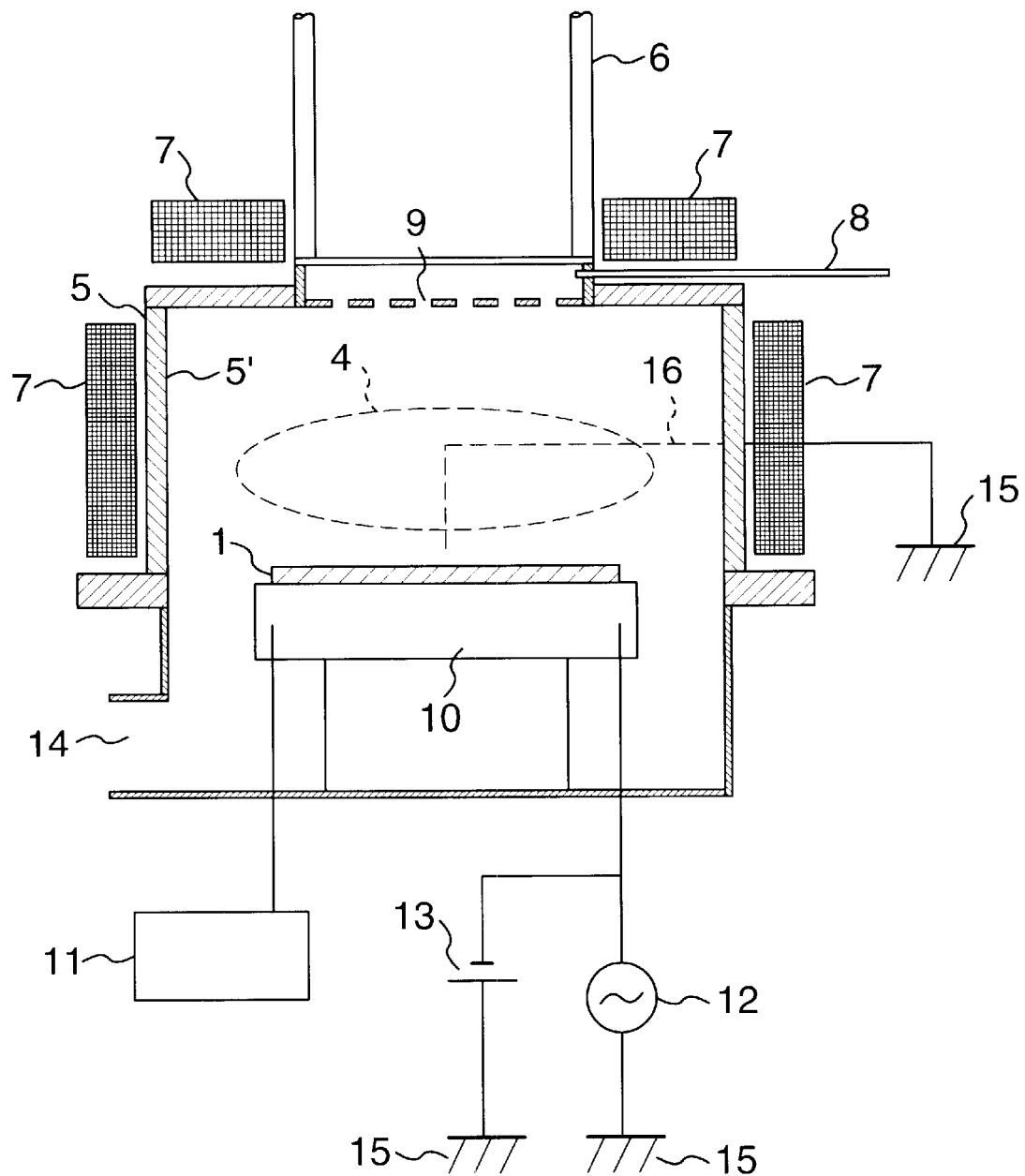
FIG. 2 is a schematic view of a dry etching apparatus for explaining Examples of the present invention.

FIG. 2 is a schematic view of a dry etching apparatus for explaining this Example. In FIG. 2, numeral 5 denotes an etching treatment room, numeral 6 denotes a waveguide for introducing a microwave into the treatment room, numeral 8 denotes a gas introducing pipe, numeral 10 denotes a substrate stage for positioning a substrate, and numeral 14 denotes an exhaust vent for vacuum exhaust.

Etching treatment is conducted by introducing an etching gas from the gas introducing pipe 8 and adjusting the pressure to a predetermined value. A microwave oscillated from a magnetron (not shown in the drawing) is introduced into the treatment room 5 through the waveguide 6 to produce plasma from the gas in the treatment room by resonance with the magnetic field formed by a solenoid coil 7. Etching is conducted by applying the plasma 4. In order to control processing shape according to recent etching treatment, there is employed an anisotropic etching wherein ions are led into the substrate stage 10 by applying RF bias using a high-frequency power source 12. Further, in order to make the temperature in the substrate surface uniform and to make the etching rate and etching shape in the substrate surface uniform, the substrate stage 10 is formed so as to adsorb the substrate 1 by electrostatic adsorption. By adsorbing on the substrate stage 10, the thermal conductivity between the substrate stage 10 and the substrate 1 can be enhanced and the temperature control of the substrate can be conducted. For such purposes, there is provided a temperature control mechanism 11 for the substrate stage 10 per se. In addition, there are devised shower holes 9 for uniformly introducing the etching gas into the treatment room 5. As mentioned above, in order to realize the anisotropic etching wherein high processing accuracy is required, there is conducted a process wherein etching is proceeded while protecting the side walls with a polymer produced by the etching. The production of the polymer which becomes a protective film is influenced by the amount of etching product retained in the treatment room 5, and the degree of influence becomes more sensitive, the finer the processing pattern becomes. For example, when the retained etching product is much, there is a tendency that the processing shape, i.e. the size d shown in FIG. 1 becomes larger due to too much attachment of the protective film. Since the amount of retained etching product in the treatment room 5 increases with an increase of the number of treated substrates, the processing shape sometimes changes even if the treatment is continued under the same conditions. In up-to-date devices, the processing size is to become 0.1 $\mu$m, so that even if this changing amount is about several nm, sometimes no sufficient properties can be obtained.

Features of this Example are that the etching treatment comprises at least two steps using different gas compositions in each step, and at least one step comprises using a gas capable of decomposing and vaporizing the etching products, or constituting the device using a laminated film etched by selecting the above-mentioned gas.

When the polysilicon film 2 shown in FIG. 1 is etched using a photoresist as a mask, it is conventional to use a mixed gas of chlorine ($Cl_2$) and oxygen ($O_2$), or a mixed gas of hydrogen bromide (HBr) and oxygen ($O_2$), or a mixed gas of HBr, $Cl_2$ and $O_2$. In such a case, etching products such are SiCl, SiH, SiO, SiBr, etc. are formed to attach to inner wall surface 5' of the treatment room. Such attached products influence etching properties.

In this Example, the etching was conducted by two steps, one of which uses a mixed gas of $CF_4$ as a gas containing fluorine (F) and Ar, and another of which uses a mixed gas of hydrogen bromide (HBr) and oxygen ($O_2$).

In the step (1), the polysilicon 2 is etched by plasma of the mixed gas of $CF_4$ and Ar. When Si is fluorinated, there is produced a substance having a very high vapor pressure, which substance can be removed after vaporization. In the step (2), using a mixed gas of HBr and $O_2$, anisotropic etching is conducted. That is, since no sufficient anisotropy is obtained by plasma etching in the mixed gas of $CF_4$+Ar, an isotropic etching is conducted by changing to the mixed gas of HBr+$O_2$.

According to this process, when the step (1) is conducted, the etching products generated in the etching treatment in the step (2) such as SiCl, SiH, SiO, SiBr, etc. can also be removed.

According to the present inventors' experiments, the discharge of the mixed gas of $CF_4$ and Ar was sufficient for 10 seconds or 20 seconds at the longest to obtain the desired effects, although changed dependent on the film thickness of the polysilicon 2 and etching area.

Since influences of etching products generated by the previous wafer treatment can be removed by the above-mentioned etching treatment (two step etching), the etching processing with good reproducibility becomes possible. Further, since the etching products are not accumulated on inner wall 5' of the etching apparatus, low contaminants can be realized. In addition, since the etching products generated in the previous etching treatment can be removed, it is not necessary to conduct a cleaning step, which is required by prior art technique, apart from the etching treatment, resulting in obtaining an effect of not lowering productivity.

In the above, the mixed gas of $CF_4$ and Ar was used, but when $CF_4$ alone or a mixed gas of $CF_4$+$O_2$ was used in place of $CF_4$+Ar, the same effects as mentioned above were obtained.

EXAMPLE 2

Figure 3:
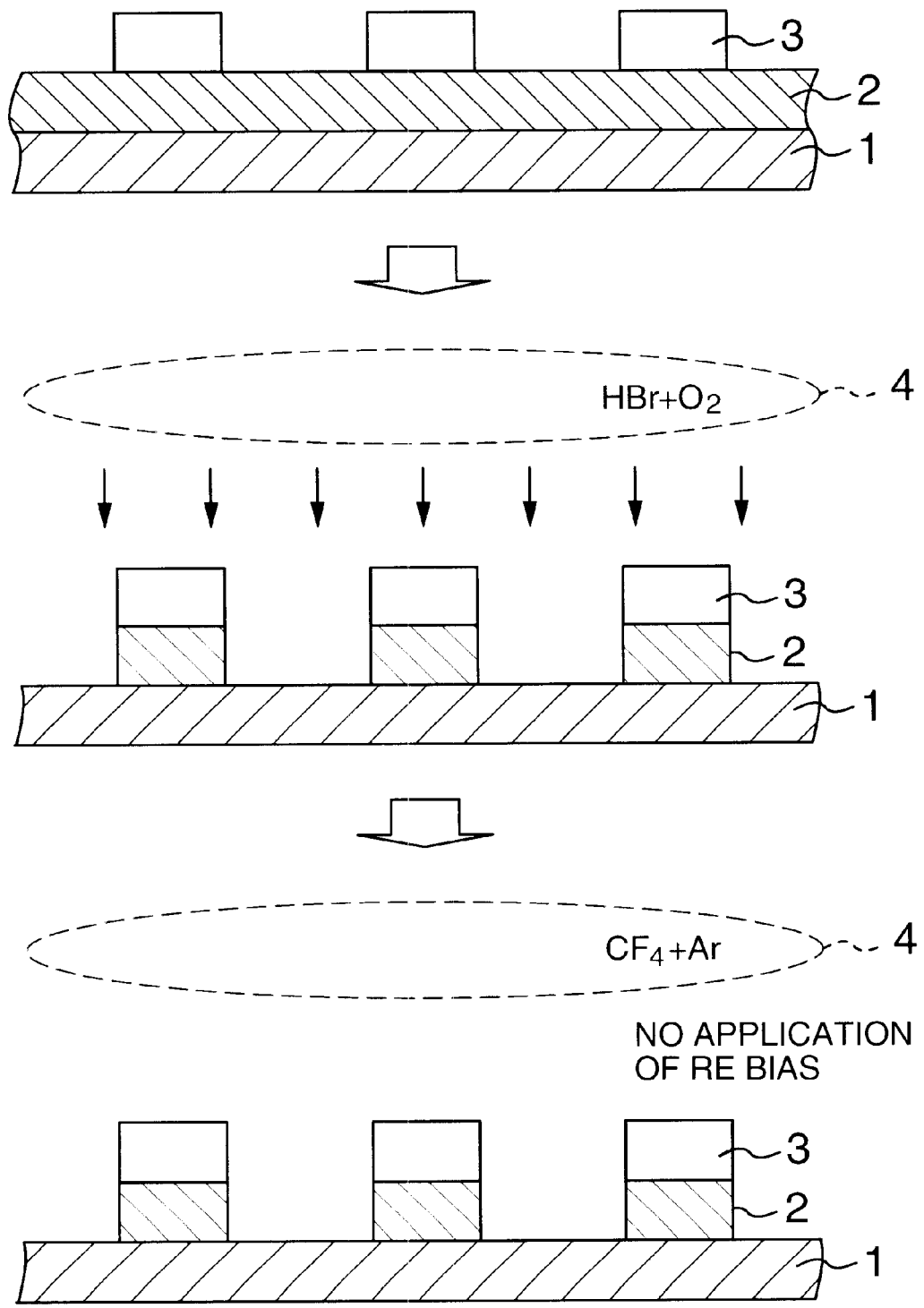
FIG. 3 is a schematic cross-sectional view of a semiconductor substrate for explaining Example 2 of the present invention.

FIG. 3 is a schematic cross-sectional vies of a substrate for explaining this Example. This Example is characterized by using a gas capable of decomposing and vaporizing compounds produced by etching for antistatic discharge of electrostatic adsorption in the case of applying electrostatic adsorption to the substrate stage.

As mentioned previously, in order to conduct etching treatment recently applied with good accuracy, it is essential that RF bias is applied to the substrate stage 10 and the substrate 1 is adsorbed by electrostatic adsorption. According to the electrostatic adsorption, a direct voltage is applied between the substrate 1 and the substrate stage 10 to store the charge between the substrate 1 and the substrate stage 10, and thus the substrate 1 is adsorbed. In order to remove the adsorption after the etching treatment, the voltage is cut. But, since the stored charge is not discharged immediately, it is necessary to connect the substrate 1 and the substrate stage 10 to earth 15. The earth from the substrate 1 in the case of electrostatic adsorption is taken from the inner wall surface while forming an earth line 16 via plasma 4, so that it is necessary to discharge for destaticization for a time necessary to discharge the stored charge.

Here, the etching of the polysilicon film 2 was conducted by the step (1) using a mixed gas of HBr and $O_2$, and after the etching, plasma of a mixed gas of $CF_4$ and Ar was used for antistatic discharge in the step (2). By the use of the plasma of mixed gas of $CF_4$ and Ar, etching products such as SiCl, SiH, SiO, SiBr, etc. generated by the etching treatment of the polysilicon 2 were removed.

In this antistatic discharge, in order to continue discharge after the end of etching, no RF bias is applied in order not to generate abnormal in processed shape. By conducting the antistatic discharge like this, it becomes possible to remove influences of the etching products on the substrate treatment in the next step. Thus the same effects as obtained in Example 1 can be obtained.

In the above, the mixed gas of $CF_4$ and Ar was used, but when $CF_4$ alone or a mixed gas of $CF_4+O_2$ was used in place of $CF_4+Ar$, the same effects as mentioned above were obtained.

EXAMPLE 3

Figure 4:
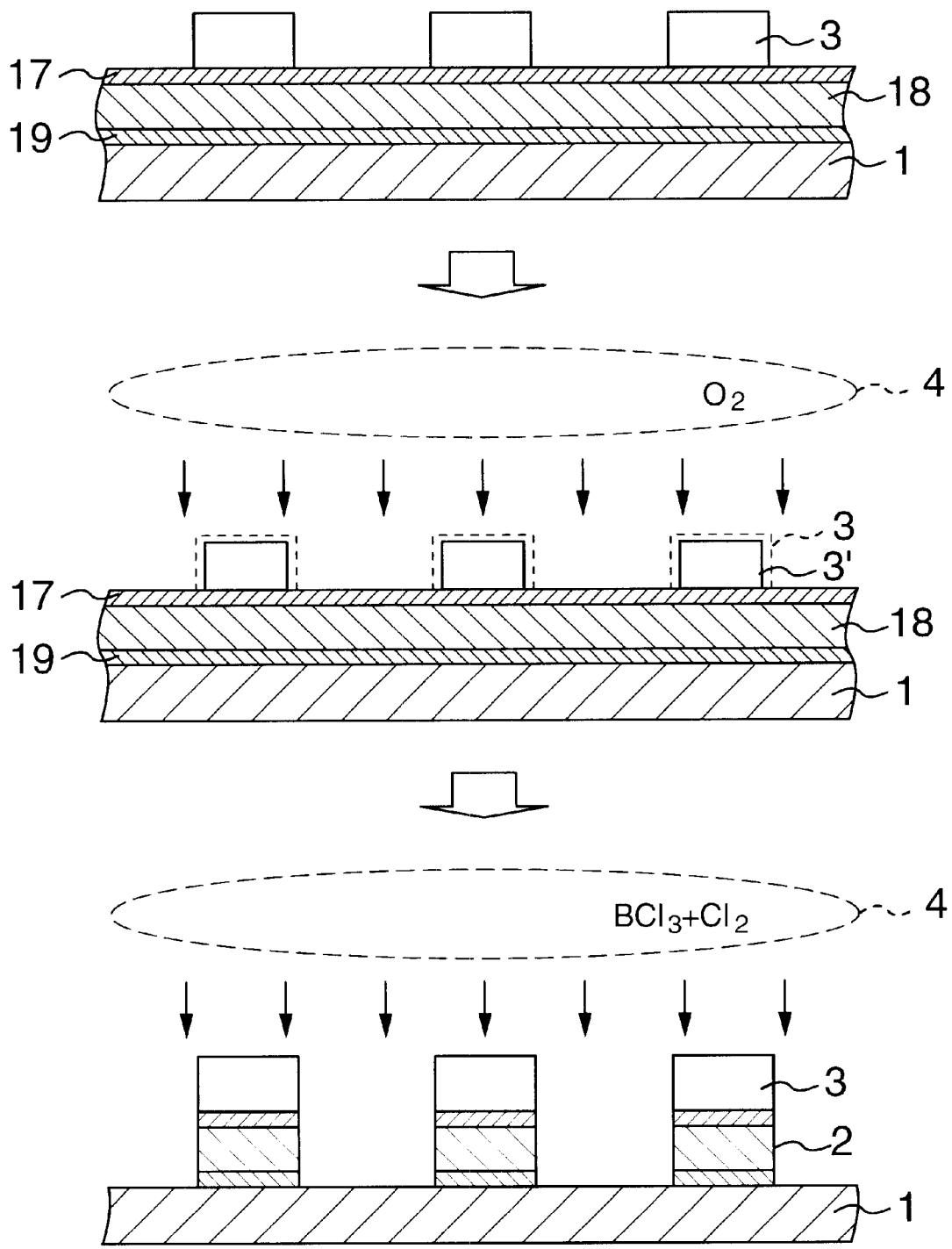
FIG. 4 is a schematic cross-sectional view of a semiconductor substrate for explaining Example 3 of the present invention.

This Example, wherein aluminum is subjected to etching treatment, is explained referring to FIG. 4 wherein numeral 1 denotes a silicon substrate, numerals 17, 18 and 19 denote a laminated film of titanium nitride, aluminum alloy and titanium nitride formed on the substrate 1 by sputtering, and numeral 3 is a photoresist having openings on areas to be processed by etching treatment.

In the case of etching a single film of aluminum alloy or a laminated film of titanium nitride/aluminum alloy/titanium nitride, it is conventional to conduct etching using a mixed gas of chlorine ($Cl_2$) and boron trichloride ($BCl_3$). According to the analysis by the present inventors, it was made clear that the etching products retained in the apparatus were organic compounds derived from the photoresist, and a mixture of aluminum and boron chlorides ($BCl_x$), and the proportion of the boron chlorides being particularly large. The residual deposit containing aluminum can be removed by the plasma of a gas containing $Cl_2$ as in the etching to produce aluminum trichloride ($AlCl_3$) having a high vapor pressure. But, since the residual products are a complicated mixture of organic materials and polymers of etching gas and the chlorine forms a shape of covering the aluminum, it is impossible to vaporize using plasma of chlorine gas.

When oxygen gas ($O_2$) plasma is discharged in the step (1), the etching products comprising organic compounds derived from the photoresist and the mixture of aluminum and born chlorides ($BCl_x$) are vaporized by bonding the organic compounds to oxygen and by subjecting the mixture of aluminum and $BCl_x$ to displacement reaction to vaporize chlorine. Further, the deposit in the form of $BCl_x$ is removed by releasing Cl molecule to produce $BCl_3$ and the Al contained in the residual deposit is also removed partially by forming $AlCl_3$. After removing the chlorine which covers aluminum by $O_2$ plasma wherein replacement of chlorine by oxygen takes place by the step (1), when plasma of a mixed gas of $Cl_2$ and $BCl_3$ is generated in the step (2), removal of the remaining aluminum compounds can be carried out. That is, by conducting plasma discharge of $O_2$ gas and plasma discharge of a mixed gas of $Cl_2$ and $BCl_3$ continuously, the etching products can be removed effectively.

In this Example, etching of the laminated film of titanium nitride 17, aluminum alloy 18 and titanium nitride 19 was conducted by two steps using the plasma of oxygen gas ($O_2$) and the plasma of mixed gas of $Cl_2$ and $BCl_3$. By the reactions mentioned above, the decomposition of organic compounds by the plasma of $O_2$ and the displacement reaction of chlorine by oxygen upon the mixture of aluminum and BCl take place. Then, etching of the laminated film of titanium nitride 17, aluminum alloy 18 and titanium nitride 19 and removal of the aluminum compounds are conducted simultaneously, resulting in capable of removing influences of etching products generated by the previous wafer treatment. Particularly, during etching of the uppermost layer of titanium nitride 17, removal of the aluminum compounds can be observed. But when a photoresist mask is used as a mask for etching, since the photoresist mask 3 is isotropically etched by the plasma of $O_2$ gas to be shrunk as shown by 3' (shrunk resist mask), it is necessary to make the photoresist mask larger than the required size.

On one hand, according to this method, there arises an advantage that it is possible to conduct processing under the minimum size possible for exposure to light by applying the shrinkage of the photoresist mask. Thus, in addition to repoducibility of processing accuracy, low contaminants and high productivity, there can be obtained an etching method suitable for very fine processing. Further, in order to make the rate of mask shrinkage minimum, it is desirable not to apply RF bias to the substrate stage 10 in the step using the plasma of $O_2$.

EXAMPLE 4

Figure 5:
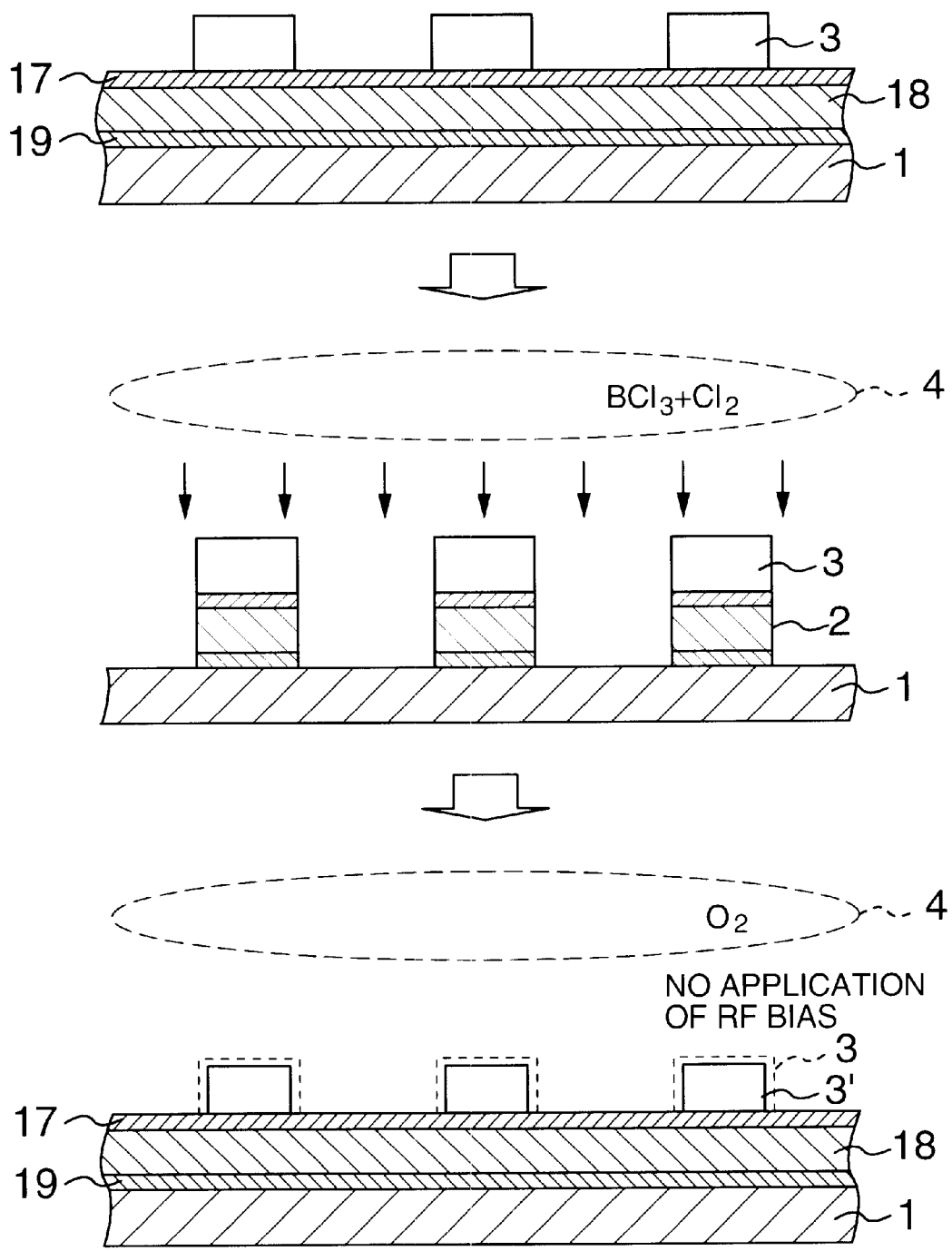
FIG. 5 is a schematic cross-sectional view of a semiconductor substrate for explaining Example 4 of the present invention.

FIG. 5 is a schematic cross-sectional view for explaining another example of etching treatment of aluminum. The film structure on the substrate is the same as Example 3 shown by FIG. 4.

In this Example, after the etching in the step (1), the plasma of $O_2$ gas is used for antistatic discharge in the step (2). By using the plasma of $O_2$ gas for antistatic discharge after the end of etching, the etching products generated by etching treatment, organic materials derived from the photoresist, and the mixture of aluminum and BCl are subjected to decomposition of the organic materials and the displacement reaction of chlorine by oxygen for the mixture of aluminum and BCl. When the next substrate treatment is conducted under this state using the plasma of mixed gas of $Cl_2$ and $BCl_3$ for the etching corresponding to the step (1), it is possible to conduct etching of a laminated film of titanium nitride 17, aluminum alloy 18 and titanium nitride 19 and removal of aluminum compounds simultaneously. That is, as in Example 3, since the plasma discharge using $O_2$ gas and the plasma discharge using a mixed gas of $Cl_2$ and $BCl_3$ are conducted continuously, it is possible to remove the etching products effectively. In this antistatic discharge, since discharge is continued after the end of etching, RF bias is not applied to the substrate stage 10 so as not to cause abnormal in the processing shape. In this case, the photoresist is shrunk by isotropic etching by the plasma of $O_2$ gas as shown by 3' as in the case of Example 3 shown by FIG. 4, but there is almost no influence of the wiring processing shape of the laminated film of titanium nitride 17, aluminum alloy 18 and titanium nitride 19.

EXAMPLE 5

This Example explains how to determine the time necessary for the step using the plasma of gas capable of decomposing and vaporizing the compounds retained in the etching apparatus in Examples 1–4 shown in FIGS. 1 and 3–5. One of the features of the present invention is to monitor the amount of attached substances on inner wall of the etching apparatus using plasma emission or mass spectrometer and to fix the time when the monitored value or its differential value reaches an lower limit value. In this Example, the plasma emission is used for applying to Example 3 shown by FIG. 4 of etching treatment of aluminum.

Figure 6:
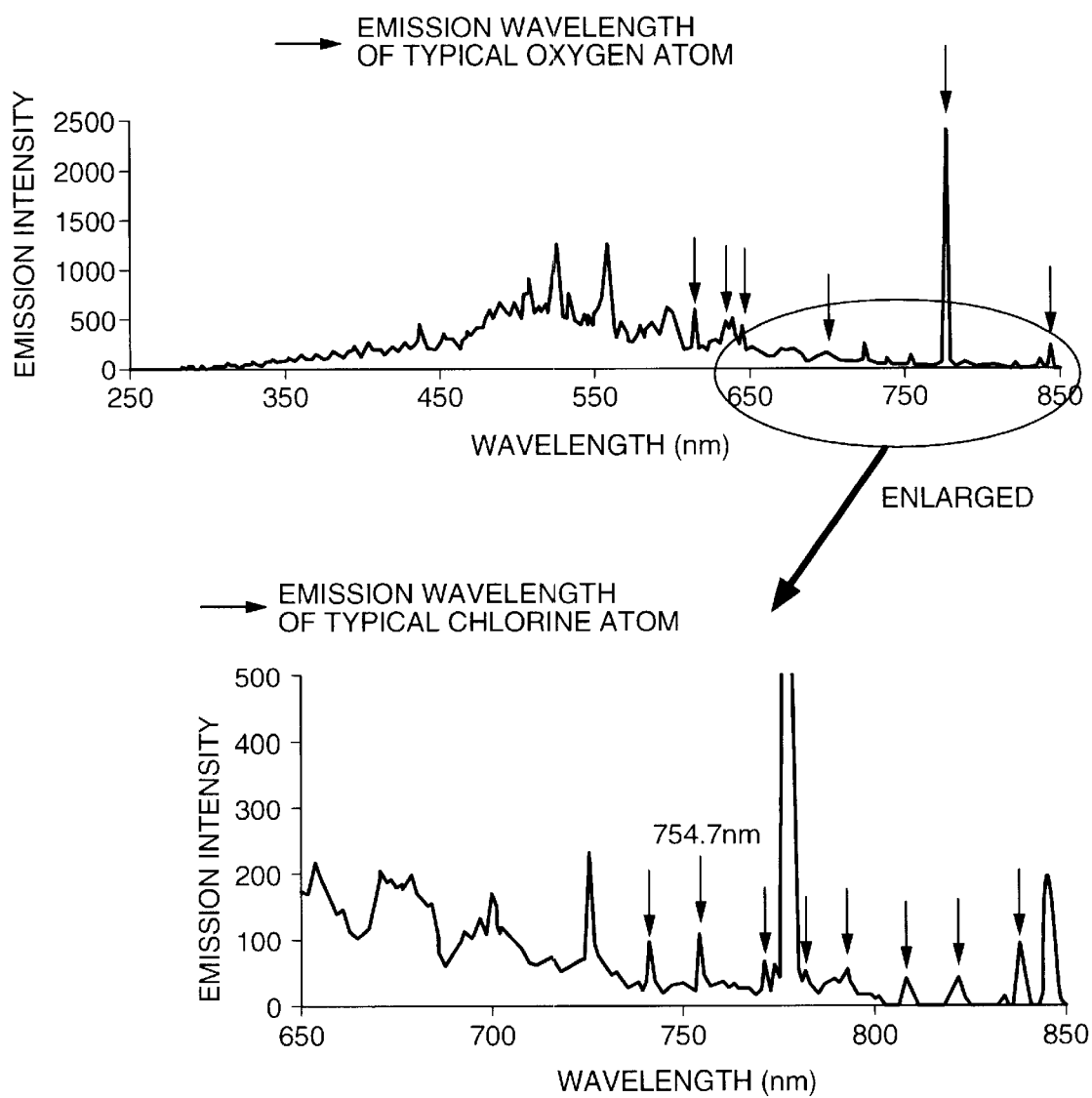
FIG. 6 is a output drawing of monitor for determining the etching time in the present invention.
Figure 7:
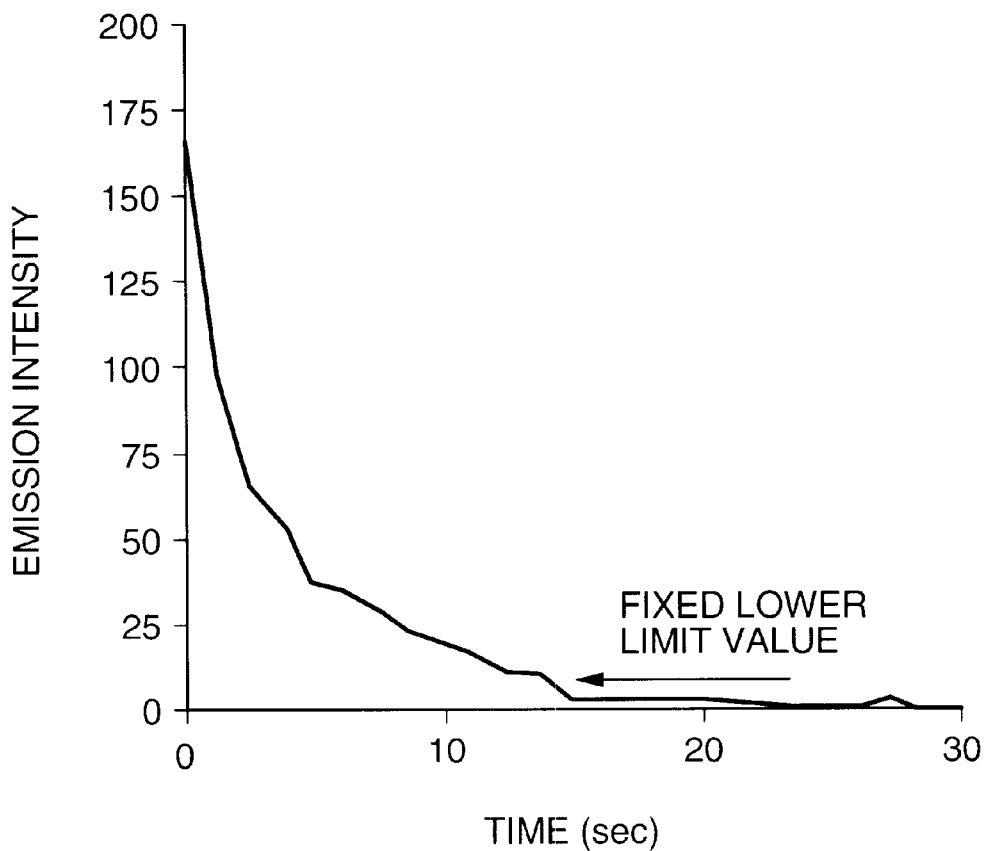
FIG. 7 is a graph showing changes of monitor values with the time for determining the etching time in the present invention.

FIG. 6 shows plasma emission spectrum after 4 seconds from the beginning of discharge during the step using the plasma of $O_2$ gas. FIG. 7 shows changes of emission wavelength of Cl atom (754.7 nm) with the lapse of time from the beginning of discharge.

As explained in Example 3, by the use of plasma of $O_2$ gas, the etching products of organic compounds and the mixture of aluminum and $BCl_x$ are subjected to decomposition of the organic compounds and the displacement reaction of chlorine by oxygen for the mixture of aluminum and $BCl_x$. Since the plasma of oxygen gas is used, it is natural that only the emission of 0 is observed. But as shown in FIG. 6, Cl is also emitted in the plasma. This means that aluminum and the mixture of $BCl_x$ are retained. Further, as is clear from FIG. 7, the decay of emission of Cl is observed. This means that the displacement reaction of chlorine by oxygen takes place and Cl is reduced by discharge of 0. That is, at the time of convergence of decay of Cl emission, it can be judged that the displacement reaction of chlorine by oxygen is finished.

While setting a lower limit of the decay value of Cl emission and regarding the time reaching the lower limit as the end of discharging time of O plasma, plasma discharge was conducted using a mixed gas of $Cl_2$ and $BCl_3$ continuously. As a result, etching shape with very good reproducibility was obtained with a little generation of contaminants. When O plasma discharge is conducted exceeding necessity, the resist mask 3 is reduced, so that it is important to reduce the discharge time to the minimum necessary time. As mentioned above, by monitoring the plasma emission, it is possible to set the minimum time necessary for decomposing and vaporizing the etching products. When the process is controlled so as to stop the discharge automatically at the time of the monitored value reaching the set value and to enter to the next step, it is possible to conduct the etching treatment more effectively.

The position of plasma generation can be controlled by the position of solenoid coil 7 shown in FIG. 2 and current value passing through the solenoid coil. By removing the position of plasma generation from the substrate, bad influences on the substrate during the decomposing and removing step mentioned above can be controlled.

In this Example, the plasma emission was monitored, but the same effects can be obtained by employing any measuring means for detecting the etching products, for example, monitoring of compositions in the retaining gas by mass spectrometer, e.g. monitoring changes of Cl concentration in the retaining gas with the lapse of time, and the like methods. Further, in this Example, changes of emission signal with time was monitored as it was, but it is possible to catch the degree of change, e.g. use of differential values of monitored values, with high sensitivity. In addition, this Example is explained using the etching of aluminum, but in the case of etching of polysilicon, signals of F and signals of SiF are to be monitored.

EXAMPLE 6

Figure 8:
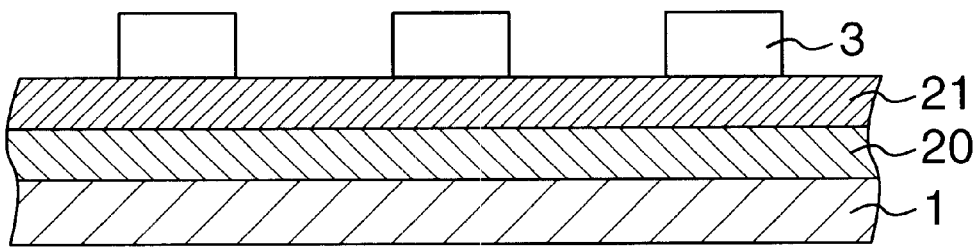
FIG. 8 is a schematic cross-sectional view of a semiconductor substrate for explaining Example 5 of the present invention.

FIG. 8 shows another example of the film structure of semiconductor device of the present invention. In FIG. 8, numeral 1 denotes a silicon substrate, numeral 20 denotes a polysilicon film formed on the substrate 1 by CVD, numeral 21 denotes a silicon oxide $SiO_2$ film formed by CVD, and numeral 3 denotes a photoresist having openings on areas to be processed by etching treatment. In such a film structure, etching of the silicon oxide film 21 and etching of the polysilicon film 21 are mostly conducted by using different etching apparatuses or different treating rooms. But in the etching of the $SiO_2$ film, when a gas containing fluorine such as $CF_4$ is used, it is possible to conduct etching of both the silicon oxide film 21 and the polysilicon film 20 in the same treating room continuously, wherein the etching products generated by the etching of the polysilicon film 20 can be removed at the time of etching treatment of the $SiO_2$ film. As films laminated on polysilicon, there can be used those which can be etched by the gas containing fluorine. It is also possible to use other films such as silicon nitride film, reflection preventing films at the time of exposure to light made from organic compounds. In the case of producing a semiconductor device by laminating two or more films with different kinds of materials on a substrate, and by forming a pattern by dry etching, it is necessary to select a material for at least one film wherein said material can be etched by a gas capable of decomposing and vaporizing compounds generated at a time of conducting etching treatment of another film. By selecting such a material, it is possible to decompose etching products generated at the time of etching of another material at the time of etching such a material. By selecting such a device structure, it is possible to produce semiconductor devices easily and with little defect ones.

In the above Examples, the photoresist is used as a mask for processing, but it is possible to use so-called hard mask such as a mask made of silicon oxide or silicon nitride with the same effects.

As explained above, since it is possible to remove influences of the etching products produced in the previous wafer treatment effectively during the etching treatment, it becomes possible to conduct etching processing with good reproducibility. Further since the etching products are not accumulated on inner walls of the apparatus, an apparatus with low contamination can be realized. In addition, comparing with the conventional process containing a cleaning treatment apart from the etching treatment, high productivity can be attained.

According to the present invention, since influences of etching products generated by previous wafer treatment can be removed effectively, etching treatment with good reproducibility becomes possible. Further, since the etching products are not accumulated on inner wall of etching apparatus, low contaminant can be realized. In addition, it is not necessary to provide a cleaning treatment in addition to the etching treatment contrary to prior art process, the downtime can be removed to attain high productivity.

What is claimed is:

1. A process for producing a semiconductor device using a plasma treating apparatus comprising an etching treatment room, a substrate stage for placing a semiconductor substrate thereon installed in the etching treatment room, a plasma generating means for generating plasma in the etching treatment room, and a gas introducing means for introducing a treating gas into the etching treatment room, said process comprising subjecting the semiconductor substrate placed on the substrate stage in the etching treatment room to plasma etching treatment using gases, wherein the plasma etching treatment comprises at least two plasma etching treatment steps using different gas compositions in each step in the same etching treatment room continuously; and at least one step of said at least two steps comprises decomposing and vaporizing, or decomposing and removing after vaporization, compounds produced by the etching treatment, while conducting the etching treatment, using a gas capable of performing said at least one step, said at least one step being conducted in the etching treatment room in place of a separate cleaning step of cleaning the plasma treating apparatus.

2. A process according to claim 1, wherein the substrate stage has an electrode for electrostatic adsorption, the at least one step comprises decomposing and removing after vaporization, and the decomposing and removing step is also used for removing electrode voltage and charge stored in the semiconductor substrate.

3. A process according to claim 1, wherein the semiconductor substrate has a film made of silicon or a compound containing silicon thereon, the at least one step comprises decomposing and vaporizing, and the gas capable of decomposing and vaporizing compounds retained in the etching treatment room is a gas containing fluorine.

4. A process according to claim 1, wherein the semiconductor substrate has a film made of aluminum or a compound containing aluminum thereon, the at least one step comprises decomposing and vaporizing, and the gas capable of decomposing and vaporizing compounds retained in the etching treatment room is a gas containing oxygen.

5. A process according to claim 1, wherein the semiconductor substrate has a film made of silicon or a compound containing silicon thereon and is held on the substrate stage by applying electrostatic adsorption, and the treating gas is a gas containing fluorine also used for removing electrode voltage and charge stored in the semiconductor substrate.

6. A process according to claim 1, wherein the semiconductor substrate has a film made of aluminum or a compound containing aluminum thereon and is held on the substrate stage by applying electrostatic adsorption, and the treating gas is a gas containing oxygen also used for removing electrode voltage and charge stored in the semiconductor substrate.

7. A process according to claim 1, wherein the plasma treating apparatus further comprises a monitoring means for monitoring a retained amount of the etching products, the at least one step comprises decomposing and removing after vaporization, and the decomposing and removing step is stopped when the retained amount reaches a predetermined lower limit value.

8. A process according to claim 2, wherein the decomposing and removing step is stopped when a retained amount reaches a predetermined lower limit value using a monitoring means for monitoring the retained amount of the etching products.

9. A process according to claim 1, wherein the at least one step comprises decomposing and removing after vaporization, and wherein in the decomposing and removing step the plasma generation position is set apart from the semiconductor substrate.

10. A process for producing a semiconductor device using a plasma treating apparatus comprising an etching treatment room, a substrate stage for placing a semiconductor substrate thereon installed in the etching treatment room, a plasma generating means for generating plasma in the etching treatment room, and a gas introducing means for introducing a treating gas into the etching treatment room,
said process comprising subjecting the semiconductor substrate placed on the substrate stage in the etching treatment room to plasma etching treatment using gases,
wherein the plasma etching treatment comprises at least two plasma etching treatment steps using different gas compositions in each step in the same etching treatment room continuously; and at least one step of said at least two steps comprises decomposing and vaporizing, or decomposing and removing after vaporization, compounds produced by the etching treatment, while conducting the etching treatment, using a gas capable of performing said at least one step, said at least one step being performed with said semiconductor substrate on the substrate stage in the etching treatment room.

11. A process according to claim 10, wherein the substrate stage has an electrode for electrostatic adsorption, the at least one step comprises decomposing and removing after vaporization, and the decomposing and removing step is also used for removing electrode voltage and charge stored in the semiconductor substrate.

12. A process according to claim 10, wherein the plasma treating apparatus further comprises a monitoring means for monitoring a retained amount of the etching products, the at least one step comprises decomposing and removing after vaporization, and the decomposing and removing step is stopped when the retained amount reaches a predetermined lower limit value.

13. A process according to claim 10, wherein the at least one step comprises decomposing and removing after vaporization, and wherein in the decomposing and removing step the plasma generation position is set apart from the semiconductor substrate.

14. A process according to claim 10, wherein said at least one step is conducted in the etching treatment room in place of a separate cleaning step of cleaning the plasma treating apparatus.

15. A process for producing a semiconductor device using a plasma treating apparatus comprising an etching treatment room, a substrate stage for placing a semiconductor substrate thereon installed in the etching treatment room, a plasma generating means for generating plasma in the etching treatment room, and a gas introducing means for introducing a treating gas into the etching treatment room,
said process comprising at least two steps of etching using a plasma,
a first step of etching being conducted by etching a semiconductor substrate on the substrate stage in the etching treatment room using a first gas composition, in forming a plasma, and
a second step of etching being conducted by etching the semiconductor substrate in the same etching treatment room continuously from the first step of etching, using a second gas composition, having a different composition from that of the first gas composition, in forming a plasma,
wherein at least one step of said at least two steps comprises conducting etching treatment while decomposing and vaporizing, or decomposing and removing after vaporization, compounds produced by a previous etching treatment without conducting a separate cleaning step.

16. A process according to claim 15, wherein said first gas composition comprises (a) $CF_4$ and Ar, (b) $CF_4$, or (c) $CF_4$ and $O_2$, and the second gas composition comprises (d) HBr and $O_2$, (e) $Cl_2$ and $O_2$, or (f) HBr, $Cl_2$ and $O_2$, and vice versa.

17. A process according to claim 15, wherein the semiconductor substrate has a film made of aluminum or a compound containing aluminum thereon, the first gas composition comprises $Cl_2$ and $BCl_3$, and the second gas composition comprises $O_2$, and vice versa.

18. A process according to claim 17, wherein during the step of etching using a gas composition comprising $O_2$, no RF bias is applied to the substrate stage.

19. A process for producing a semiconductor device using a plasma treating apparatus comprising an etching treatment room, a substrate stage for placing a semiconductor substrate thereon installed in the etching treatment room, a plasma generating means for generating plasma in the etching treatment room, and a gas introducing means for introducing a treating gas into the etching treatment room, said process comprising at least two steps of etching using a plasma, a first step of etching being conducted by etching a semiconductor substrate on the substrate stage in the etching treatment room using a first gas composition, in forming a plasma, and a second step of etching being conducted by etching the semiconductor substrate in the same etching treatment room continuously from the first step of etching, using a second gas composition, having a different composition from that of the first gas composition, in forming a plasma, wherein at least one step of said at least two steps comprises conducting etching treatment and removing etching products generated by a previous substrate treatment simultaneously, resulting in making it possible to shrink a photoresist mask or a hard mask for conducting very fine processing.

20. A process according to claim 19, wherein the hard mask is a mask made of silicon oxide or silicon nitride.

* * * * *